United States Patent [19]
Yu et al.

[11] Patent Number: 6,091,138
[45] Date of Patent: Jul. 18, 2000

[54] MULTI-CHIP PACKAGING USING BUMP TECHNOLOGY

[75] Inventors: Allen S. Yu, Fremont; Paul J. Steffan, Elk Grove; Thomas Charles Scholer, San Jose, all of Calif.

[73] Assignee: Advanced Micro Devices, Inc., Sunnyvale, Calif.

[21] Appl. No.: 09/032,398

[22] Filed: Feb. 27, 1998

[51] Int. Cl.$^7$ ..................................................... H01L 23/02

[52] U.S. Cl. .......................... 257/686; 257/777; 257/778; 257/723

[58] Field of Search ..................................... 257/777, 778, 257/678, 686, 690, 723, 724, 698, 697, 776; 438/108, 109, 110

[56] References Cited

U.S. PATENT DOCUMENTS

| | | | |
|---|---|---|---|
| 4,122,479 | 10/1978 | Sugawara et al. | 250/551 |
| 5,591,959 | 1/1997 | Cigna et al. | 257/777 |
| 5,719,438 | 2/1998 | Beilstein, Jr. et al. | 257/777 |
| 5,760,478 | 6/1998 | Bozso et al. | 257/777 |
| 5,790,384 | 8/1998 | Ahmad et al. | 257/777 |
| 5,828,126 | 10/1998 | Thomas | 257/695 |
| 5,977,640 | 11/1999 | Bertin et al. | 257/777 |

*Primary Examiner*—Olik Chaudhuri
*Assistant Examiner*—Phat X. Cao
*Attorney, Agent, or Firm*—H. Donald Nelson

[57] ABSTRACT

A multichip integrated semiconductor device having a portion of a first chip bonded to electrical leads in a package using a flip chip technology such as solder bump technology and a second chip bonded to a second portion of the first chip using a flip chip technology such as solder bump technology.

5 Claims, 1 Drawing Sheet

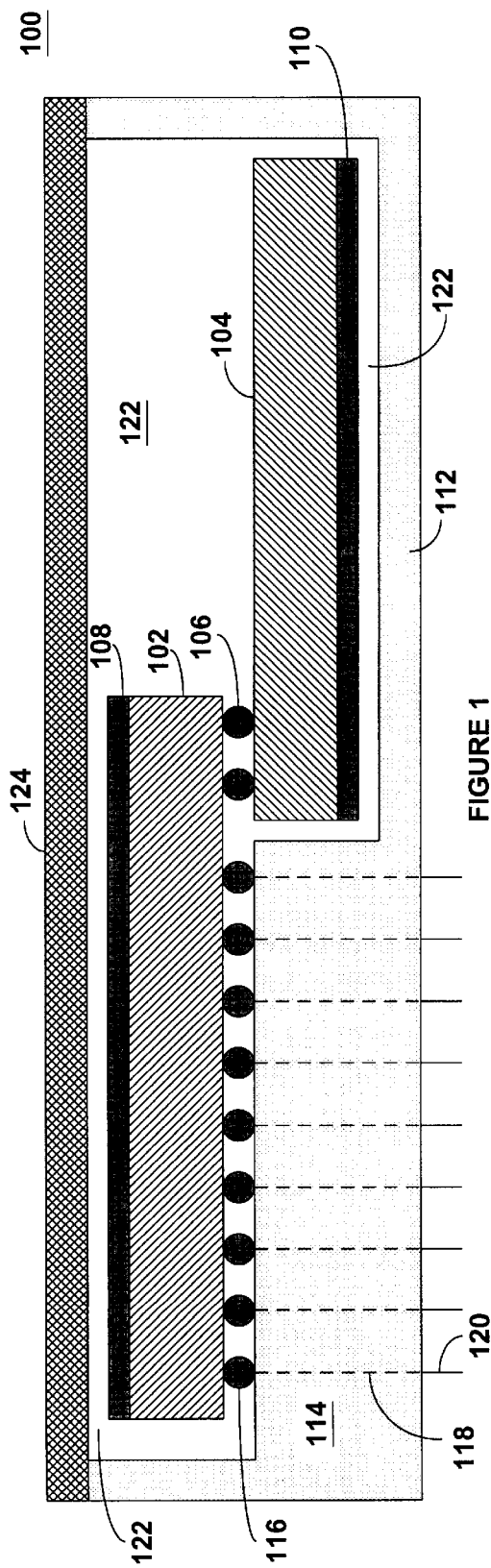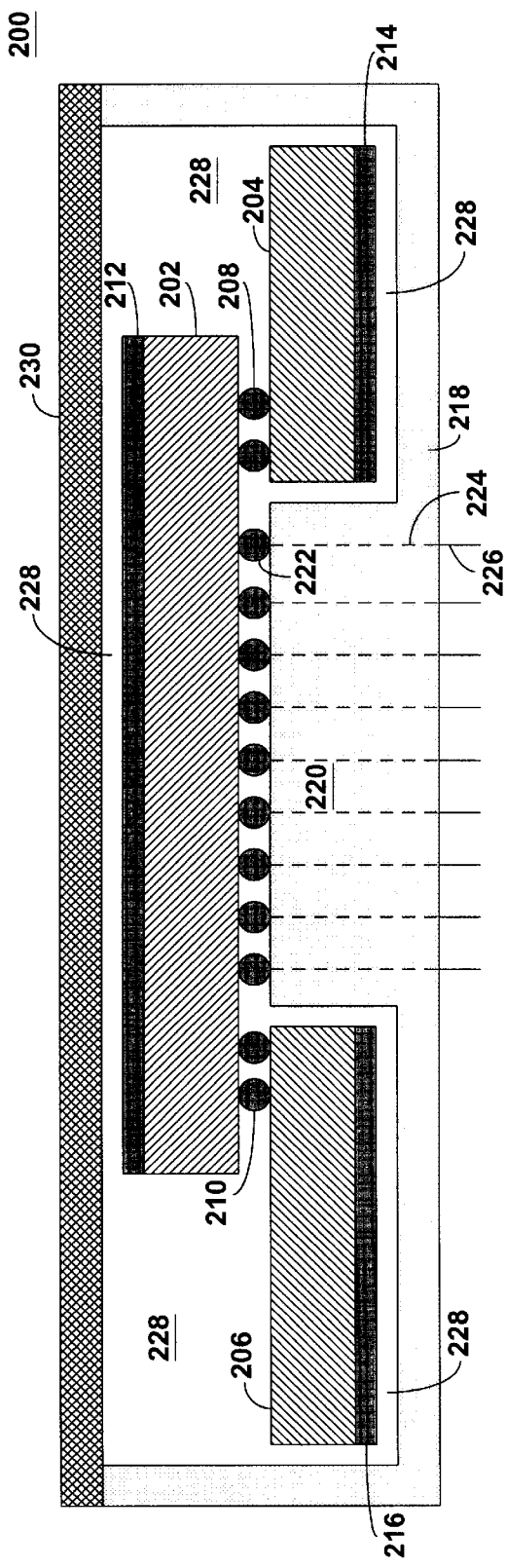

MULTI-CHIP PACKAGING USING BUMP TECHNOLOGY

CROSS-REFERENCE TO RELATED APPLICATIONS

This application is related to application, Ser. No. 09/032,362, entitled MULTIPLE CHIP HYBRID PACKAGE USING BUMP TECHNOLOGY, filed on the filing date of this application and assigned to the assignee of this application.

BACKGROUND OF THE INVENTION

1. Field of the Invention

This invention relates generally to a method of interconnecting two or more semiconductor chips. More specifically, this invention relates to a method of interconnecting two or more semiconductor chips using flip chip technology. Even more specifically, this invention relates to a method of interconnecting two or more semiconductor chips using solder bump technology.

2. Discussion of the Related Art

The semiconductor industry is increasingly characterized by a growing trend toward integrating more circuits on a given semiconductor chip. In addition, the circuits are more complex in order to provide the higher performance required by end users of the semiconductor chips. To achieve the higher performance demanded by the end users it is necessary to not only provide more complexity in the circuits and the functions the circuits perform, but also to ensure that the circuits are smaller and faster. This is being achieved by not only reducing the size of individual devices but by placing the circuits closer together. In turn, this means that more circuits have to be interconnected. The method of interconnection must not detract from the performance and speed of the various circuits on the semiconductor chip.

Interconnections provide paths or mediums for electrical signals that are delivered from source devices to destination or load devices. Because one of the major problems associated with interconnections is that the passage of electrical signals through interconnections takes time, the performance of the interconnected circuits is degraded. Another problem with interconnections is that interconnections have finite resistances that cause heat in the chips to be generated that must be dissipated. Because of these problems, the trend in the semiconductor industry is to integrate peripheral devices, such as cache memory, onto a single monolithic chip. The integration of the peripheral devices onto a single chip improves signal processing, timing and performance of the integrated circuits as well as reduces generated heat. However, the integration places a greater strain on the fabrication of the integrated device.

With shrinking geometries and therefore greater device densities, an eversmaller single defect can kill an entire single integrated device. As can be appreciated, the larger the die, the higher probability that a single defect can kill the device. Yield is a measure of good die obtained from a wafer. Since net good die on a wafer is inversely proportional to the size of the die, one approach to increase yield would be to separate out the major components of a highly integrated device into its individual components on different chips. The resultant "silicon" yield of a combination of the individual components will exceed the silicon yield of the monolithic device by an appreciable measure.

One of the current methods to package semiconductor devices is flip chip technology in which a chip has either solder bumps or bond pads on the active face of the chip. Flip chip technology is defined as mounting the semiconductor chip to a substrate with any kind of interconnect materials and methods such as fluxless solder bumps, tape-automated bonding (TAB), wire interconnects, conductive polymers, anisotropic conductive adhesives, metallurgy bumps, compliant bumps, and pressure contacts as long as the active chip surface is facing the substrate (the package). In one method, the chip is placed face down onto a package so the solder bumps or bond pads on the chip are aligned and contact solder bumps or bond pads on the package. The device is reflowed (heated) so that the solder bumps and bond pads form metallurgical bonds.

Presently, there is a tradeoff between integrating more peripheral devices onto a single monolithic chip with improved performance and decreased yield or sacrificing performance for improved yield.

Therefore, what is needed is a method of integrating peripheral circuits and devices to obtain improved performance and at the same time obtain improved yield.

SUMMARY OF THE INVENTION

According to the present invention, the foregoing and other objects and advantages are attained by a multichip integrated semiconductor device and a method of assembling the multichip integrated semiconductor device in which a first chip is bonded to a package and is bonded to a second chip.

In one aspect of the invention, the first chip is bonded to the package and the second chip in a flip chip configuration.

In another aspect of the invention, the first chip is bonded to the package and the second using solder bump technology.

In a second aspect of the invention, at least a third chip is bonded to the first chip in a flip chip configuration.

The chips are enclosed in a package that is filled with a material to provide structural stability and environmental protection to the chips inside the package and a lid is placed on the package.

The method of this invention provides a multichip integrated semiconductor device that has high performance provided by the packaging of related chips using bump technology and at the same time taking advantage of increased yield provided by being able to use tested individual peripheral chips.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIG. 1 shows a first embodiment of the present invention showing two chips interconnected in accordance with the present invention; and FIG. 2 shows a second embodiment of the present invention showing three chips interconnected in accordance with the present invention.

DETAILED DESCRIPTION

Reference is now made in detail to specific embodiments of the present invention which illustrate the best mode presently contemplated by the inventors for practicing the invention.

FIG. 1 shows a first embodiment of the present invention with two chips interconnected in accordance with the present invention to form a single integrated device 100. The single integrated device 100 has a first chip 102 and a second chip 104 interconnected by solder bumps, one of which is indicated at 106. The first chip 102 may be a central processing unit (CPU) and the second chip 104 may be a memory chip such as an SRAM, a FLASH memory or graphic memory. The semiconductor substrate of the first chip 102 is shown at 108. The semiconductor substrate of the second chip 104 is shown at 110. As can be appreciated, the active portions of the chips are not shown. The first chip 102 and the second chip 104 are packaged in a package 112. The first chip 102 is bonded to a portion 114 of the package 112 by solder bumps, one of which is indicated at 116. The solder bump technology 116 provides electrical communication via wire leads, one of which is indicated at 118, to pins, one of which is indicated at 120. The interior portions 122 of the package 112 are filled with a gel or epoxy. The gel or epoxy protects the structure from the environment and provides structural stability to the integrated device 100. A lid 124 completes the enclosure of the package 112.

FIG. 2 shows a second embodiment of the present invention with three chips interconnected in accordance with the present invention to form a single integrated 200. The single integrated device 200 has a first chip 202, a second chip 204, and a third chip 206 interconnected by solder bump technology. The second chip 204 is connected to the first chip 202 by solder bumps, one of which is indicated at 208. The third chip is connected to the first chip 202 by solder bumps, one of which is indicated at 210. The first chip 202 may be a central processing unit (CPU) and the second chip 204 and the third chip 206 are known as peripheral chips and may be a memory chip such as an SRAM, FLASH memory or graphic memory. The semiconductor substrate of the first chip 202 is shown at 212, the semiconductor substrate of the second chip 204 is shown at 214 and the semiconductor substrate of the third chip 206 is shown at 216. The active portions of the chips are not shown. The three interconnected chips 202, 204 and 206 are enclosed in a package structure 218. The first chip 202 is bonded to a portion 220 of the package 218 by solder bumps, one of which is indicated at 222. The solder bumps 222 provide electrical communication via wire leads, one of which is indicated at 224 to pins, one of which is indicated at 226. The interior portions 228 of the package are filled with a gel or epoxy. The gel or epoxy protects the structure from the environment and provides structural stability to the integrated device 200. A lid 230 completes the enclosure of the package 218.

In summary, the results and advantages of the method of the present invention is obtained with a multichip integrated semiconductor device that has both high performance and increased yield. The high performance is provided by the packaging of interconnected related chips using bump technology and the increased yield is provided by being able to use individual tested peripheral chips when connecting the peripheral chips.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A multichip integrated semiconductor device, comprising:

a package having electrical leads connecting terminals inside the package to pins outside the package;

a first portion of a first chip electrically connected to the electrical leads inside the package using flip chip solder bump technology, wherein solder bumps electrically connect electrical terminals in the first chip to the electrical leads;

a second chip electrically connected to a second portion of the first chip using flip chip solder bump technology, wherein solder bumps electrically connect electrical terminals in the first chip to the electrical terminals in the second chip; and at least a third chip extending beyond an edge of the first chip and electrically connected to a third portion of the first chip.

2. The multichip integrated semiconductor device of claim 1 wherein the third chip is electrically connected to the first chip using flip chip technology.

3. The multichip integrated semiconductor device of claim 2 wherein the flip chip technology used is solder bump technology.

4. The multichip integrated semiconductor device of claim 3 wherein the package is filled with a material to provide structural stability and environmental protection to the chips in the package.

5. The multichip integrated semiconductor device of claim 4 further comprising a lid on the package.

* * * * *